(12) United States Patent
Gibson

(10) Patent No.: US 6,710,524 B2
(45) Date of Patent: Mar. 23, 2004

(54) PLASMA SOURCE

(75) Inventor: Desmond Gibson, Peterborough (GB)

(73) Assignee: Satis Vacuum Industries Vertrieb AG, Baar (CH)

( * ) Notice: Subject to any disclaimer, the term of this patent is extended or adjusted under 35 U.S.C. 154(b) by 97 days.

(21) Appl. No.: 09/828,737

(22) Filed: Apr. 9, 2001

(65) Prior Publication Data

US 2002/0008451 A1 Jan. 24, 2002

(30) Foreign Application Priority Data

Apr. 11, 2000 (GB) .............................................. 0008905
Jun. 2, 2000 (GB) .............................................. 0013496

(51) Int. Cl.$^7$ ................................................ H01J 17/26
(52) U.S. Cl. ............................ 313/231.31; 315/111.21; 315/111.81; 118/723 E
(58) Field of Search ........................ 313/231.41, 231.3, 313/362, 231.31; 315/111.01, 111.21, 111.31, 111.81, 111.41; 118/723, 723 E, 723 R

(56) References Cited

U.S. PATENT DOCUMENTS

| 4,301,391 A | * | 11/1981 | Seliger et al. .......... 315/111.31 |
| 4,980,610 A | * | 12/1990 | Varga |
| 5,075,594 A | * | 12/1991 | Schumacher et al. ... 315/111.21 |
| 5,552,675 A | * | 9/1996 | Lemelson .............. 315/111.21 |
| 6,414,438 B1 | * | 7/2002 | Borisov et al. ......... 315/111.31 |
| 6,504,307 B1 | * | 1/2003 | Malik et al. ............ 315/111.21 |

FOREIGN PATENT DOCUMENTS

FR 2557415 A1 6/1985

* cited by examiner

Primary Examiner—Don Wong
Assistant Examiner—Jimmy T. Vu
(74) Attorney, Agent, or Firm—Roberts, Mlotkowski & Hobbes; Peter W. Roberts

(57) ABSTRACT

A plasma source comprises a thermionic emitter (2) heated by an induction coil (7), which also provides radiofrequency energy within an electrically insulated cylindrical former (1). A cylindrical anode (10) is concentric with emitter (2) and axially displaced therefrom, generating a potential difference between anode (10) and emitter (2). The potential difference between anode (2) and ground and axial magnetic fields causes the plasma to be extracted from the source. Emitter (2) is held at negative potential via a conductive support (5). Process gas is introduced near emitter (2) and a secondary gas injected in the anode space. Radiofrequency excitation of emitter (2) generates electrons via thermionic and field effects, resulting in efficient plasma generation. Both electron generation effects contribute to a broad energy spectrum of electrons, providing effective neutralization of the plasma. Moreover, the time varying axial magnetic field induced by coil (7) in the vicinity of emitter (2) provides enhancement of plasma generation and confinement of plasma to minimize erosion of emitter (2).

9 Claims, 8 Drawing Sheets

Sample baked at 250°C for 2 hours-
no optical drift detected when measured while still hot

PLASMA SOURCE

FIELD

This invention relates to a plasma source. The invention also relates to a method of generating plasma, and to an apparatus for coating or cleaning substrates. More particularly, this invention relates to a plasma source in which radiofrequency energy is inductively coupled to both a thermionic-field emitter, thereby generating electrons with broad energy distribution for plasma generation and neutralisation, and a discharge process generating a plasma having ions and electrons.

BACKGROUND

Such a plasma source can be effectively used in the vacuum processing of thin film coatings during electron beam or thermal deposition. The energy imparted by the source to the growing film is capable of modifying the microstructure producing dense, near stoichiometric films that are impervious to temperature and humidity variations. The refractive index achieved is near that of the bulk materials, thus extending the possibilities for multilayer thin film design.

Substrate heating is superfluous with assisted deposition processes. Low temperature coating is a major process advantage offering low-cost fixturing, time/cost and compatibility with low-temperature materials such as plastics.

Plasma sources are also exceptional for in situ substrate cleaning. In particular, argon cleaning provides physical sputter removal of adsorbed water and residual cleaning solvents. Oxygen cleaning can stimulate chemical removal of hydrocarbons through the formation of volatile species.

A primary application for such sources includes precision optical coatings of oxide and fluoride based deposition materials. Examples include anti-reflection coatings for ophthalmic lenses, high tolerance multilayer dielectric optical coatings for telecommunications and high laser damage coatings.

Currently available plasma or ion sources for assisted vacuum deposition processes are have been described in the prior art, such as, for example, U.S. Pat. No. 4,862,032, EP-A-0463230, WO96/30928, FR-2557415 and in S. Pongratz and A. Zoller, J. Vac. Sci. Technol. A 10(4), p 1897, Jul./Aug. 1992.

Certain commercially available plasma sources have a length such that they require a well in the base plate to ensure that positioning within the vacuum chamber does not mask deposition sources due to excessive source height. Consequently such systems require a specialised vacuum chamber for operation and are not readily retrofittable to other vacuum systems.

In plasma deposition, the term neutralisation refers to a state in which there is a balance of ions and electrons. In the absence of neutralisation (which usually involves a surplus of ions) three deleterious effects can occur:

1. Electrons can be drawn to the beam in short-duration arcs that can eject small particles from the arc location. These arcs can cause damage to a sensitive substrate surface and also introduce contamination into the growing film.
2. The occurrence of the arcs as described in 1 also leads to temporal variation in beam-plasma voltage which causes process variation.
3. Space charge effect which spreads the plasma spatial distribution and also introduces edge effects for dielectric substrates mounted in metal holders.

This effect manifests itself as a film thickness variation.

Plasma/ion sources which rely on only thermionic emission have a very narrow electron energy emission characteristic with minimal lower energy electrons as shown in FIG. 1. This problem is overcome in ion sources through use of a separate supply of electrons injected into the plasma to provide neutralization. Current plasma sources rely upon the thermionic electron emission to provide sufficient electrons with necessary energy to provide neutralisation. This method does not provide adequate control over neutralisation and as such effects 1, 2 and 3 above are encountered.

Other ion source systems employing inductively coupled RF energy have been described (see, for example, U.S. Pat. No. 4,104,875). Such systems are susceptible to conductive deposits on the non-conductive window isolating the inductor from the plasma region. Capacitively coupled RF discharge processes have also been used in ion and plasma sources (see, for example, EP-A-0474584).

All of the plasma/ion sources described above have fixed spatial distribution of the ion/plasma flux at the substrate plane, engineered for ion/plasma overlap over the full deposition area or positioned to provide the best overlap with the evaporant fluxes. Such sources compromise achieving the full benefits of assisted deposition as each application requires a specific match of ion/plasma spatial distribution depending upon coating type, required substrate loading over deposition area, deposition material(s), evaporant source flux and film parameter(s) to be optimised via ion/plasma bombardment.

Moreover, sputtering of the thermionic emitter material causes changes in the emitter spatial profile which varies the spatial distribution of emitted electrons with source operating time and hence the plasma distribution.

A general object of the present invention is to provide a radiofrequency energy driven plasma source with enhanced plasma generation, control and neutralisation. Another object of the present invention is to provide a plasma source which avoids the disadvantages and deleterious features of such plasma sources as described above. Broadly we achieve this by using induction to help generate the ions from an electron emitter of a plasma source.

SUMMARY

According to a first aspect of the present invention there is provided a plasma source comprising an inlet for a gas which is ionisable to produce a plasma, an electron emitter for producing electrons for ionising the gas, an RF induction coil at least partially surrounding the electron emitter, and an anode.

Preferably, the plasma source further comprises a cylindrical former of electrical insulator material capable of withstanding high temperature, and the emitter is disposed within the former. In an embodiment, the emitter is in the form of multiple cylinders of thermionic-field emitting material arranged on the circumference of a circle lying within the insulating former. We also prefer that plasma source includes a removable base, said base including at least part of the gas inlet. The base may also include apertures through which electrical wires for the emitter, the anode and the induction coil may extend.

The emitter emits thermionic electrons for the generation of the plasma, when held at a negative potential and subjected to heating. In effect, the emitter acts as a cathode.

In a preferred embodiment, at least part of the electron emitter is dome-shaped. More preferably, the emitter is in the form of a cylinder having a domed top.

In an embodiment, the emitter is in the form of a cylinder of varied width and height with a flat top, thereby allowing the spatial distribution of emitted electrons to be changed.

The anode, which is desirably cylindrical, is preferably concentric with the emitter and axially displaced therefrom, generating a potential difference between anode and emitter. The potential difference between anode and ground and axial magnetic fields causes the plasma to be extracted from the source. More preferably, the axial displacement of the anode from the emitter is adjustable. We prefer that a cap is disposed between the anode and cathode, and we also prefer that the cap has an aperture of variable size.

Preferably, the electron emitter is supported by a conductive support column, by means of which the emitter can be held at a negative potential. The emitter is desirably disposed substantially concentrically within the induction coil and the former, the former being disposed within the induction coil. Preferably the induction coil is water cooled.

The induction coil can be operated to perform a number of advantageous functions. In order to generate the plasma it is necessary to heat the emitter, and this can be achieved by means of the induction coil which can be operated to deliver energy to heat the emitter. There are important benefits to induction heating, as compared with direct or radiative heating. In particular, there is no contact with the workpiece, which makes possible a modular plasma source construction. This can accommodate a range of thermionic-field emitter configurations which provide consistency and controllability which is particularly important to ensure constancy in plasma source output over extended periods of time.

We have found that the induction coil is that is can be operated to deliver energy within the former for the generation of broad energy spectrum electrons for effective neutralisation of the plasma. The radiofrequency excitation of the emitter generates electrons via thermionic and field effects, resulting in efficient plasma generation. Both electron generation effects contribute to the broad energy spectrum of electrons, providing effective neutralisation of the plasma. Thus, in an advantageous embodiment of the invention there is provided a control means for the induction coil to control the induction coil to deliver energy within the former for the generation of broad energy spectrum electrons for effective neutralisation of the plasma Yet another important function of the induction coil which we have found is that it can be operated to produce a time varying axial magnetic field for enhancement of plasma generation and confinement of said plasma to minimise emitter erosion. The induced axial time varying magnetic field can act to locally shield the emitter from ion bombardment and thereby minimize bombardment of the emitter and resulting emitter. This also minimises resulting contamination from emitter sputtered material of the plasma source and resulting plasma. Thus another advantageous embodiment of the invention involves the provision of a control means for the induction coil to control the induction coil to produce a time varying axial magnetic field.

In turn, minimising the erosion of the emitter preserves the emitter spatial profile which ensures constancy of spatial distribution of emitted electrons and hence resulting plasma spatial distribution.

Additionally, sputtered emitter contamination, which is conductive, tends to deposit on the sidewall of the plasma source and thereby reduces inductive coupling. This effect is minimized by the provision of the time varying electromagnetic field.

As mentioned above, the use of the RF induction coil can cause electrons to be generated by thermionic and field effects. The induced skin effect at the emitter surface provides field enhanced emission whereby the current flow within the skin depth induces a strong localized electric field at the surface of the emitter such that electrons are attracted out of the emitter.

This effect increases effective electron emission by two well known mechanisms: firstly lowering the effective work function at the surface and thereby increasing thermionic emission (Schottky emission—reference C. Herring et al, Rev. Mod. Phys. 21, 185 [1949]) and secondly, emission through the quantum mechanical tunneling effect by which electrons can leak through the surface potential barrier (referred to as strong field emission, see reference R. Fowler et al, Proc. Roy. Soc. A119, 173 [1928]). The combination of these effects to generate electron emission from the emitter is referred to as thermionic-field emission.

The emitter may comprise a high efficiency emitter material such as tungsten, molybdenum (including coatings which reduce work function and/or modify Fermi level) or lanthanum hexaboride (reference J. M. Rafferty, Journal of Applied Physics, Vol 22, Number 3, p299, Mar. 1953); these can be configured to maximize the thermionic-field emission area and minimize inhomogeneous field effects. Moreover, the induced emitter skin depth is typically a few hundred microns, allowing possible use of relatively thin foil material for the emitter and thereby minimizing thermal mass and consequent inertia in achieving the desired temperature.

It is especially preferred that the coating material is diamond, whose electronic properties are such that when it is biased negatively in a vacuum, electrons are ejected from the surface (reference G. T. Mearini et al, Investigation of diamond films for electronic devices, Surf and Interface Anal., vol. 21, 1994, pp. 138 –143). Thus, in accordance with another aspect of the invention there is provided a diamond coated emitter for a plasma source. The former may also be useful as an ion source for use in ion assisted deposition and as an electron source for use in electron beam evaporation. In diamond the work function is small, perhaps negative (referred to as negative electron affinity). In practice this means that thermionic-field emitters based on diamond consume low power and offer high efficiencies such as those utilised in flat panel display applications.

Specific benefits as an emitter are lower operating temperatures (500° to 1000° C.) and lower electric fields (orders of magnitude less than conventional field emission materials—typically $10^{-4}$ V/cm) for field emission.

Use of electrically conductive substrates provide a means of heating an applied diamond film via an induction coil and also application of a negative voltage to the emitter material. It is particularly preferred that the diamond is coated on metals which exhibit carbide formation as a localised interfacial layer as a consequence of low mutual solubility with carbon. Such metals include as Mb Ti, Zr, Ta, Hf, W and Mo. The carbide layer acts as a bonding layer which promotes growth of a chemical vapour deposited layer, and aids adhesion by stress relief at the interface.

It is desirable for the plasma source also to comprise a secondary inlet for said gas, said secondary inlet being arranged to inject the gas into a space within the anode.

In a preferred embodiment, the anode is surrounded by an electromagnet capable of producing a time invariant magnetic field. It is especially preferred that the time invariant magnetic field produced by the electromagnet is deconvoluted from the induced time variant magnetic field. This deconvolution can be achieved by proper choice of the field strength of the electromagnet and the induction coil, and by appropriate spacing of the electromagnet and the induction coil. The aim is to ensure that there is no significant interaction between the magnetic fields of the electromagnet and the induction coil.

The deconvolution of the induced magnetic field from the time invariant electromagnetic field allows separate control of source plasma spatial distribution by the induction coil field and the electromagnet field. Spatial control of plasma flux at the substrate plane is provided by the relative positioning of the electromagnet with respect to the induction coil. A greater spatial spread of plasma flux is achieved by increasing the separation of electromagnet and induction coil.

The anode and the electromagnet are conveniently supported by the former. Preferably, the electromagnet is adapted to slide on and off the anode and is adjustable with respect to displacement from the induction coil.

In a preferred embodiment, the electromagnet is in the form of a coil, the number of turns of which is varied along its length to spatially vary the magnetic field and hence the plasma spatial distribution at the substrate plane. It is also preferred that the electromagnet coil is frequency and phase coupled with the induction coil.

In an especially preferred embodiment, the anode and the emitter have separate electrical supplies. More preferably, said separate supplies have a common earth.

In an embodiment, a reactive gas inlet is located at the top of the anode.

According to another aspect of the present invention there is provided a method of generating a plasma comprising: flowing an ionisable gas in contact with an electron emitter, the electron emitter being held at a negative potential; and heating the electron emitter using a RF induction coil to produce electrons from the emitter which ionise the gas to produce a plasma.

Preferably, the induction coil is operated to deliver energy within the former for the generation of broad energy spectrum electrons for effective neutralisation of said plasma.

Preferably, the induction coil is operated to produce a time varying axial magnetic field for enhancement of plasma generation and confinement of said plasma to minimise emitter erosion.

Desirably, an anode and an electromagnet coil are disposed downstream of the emitter, and the method further comprises producing a time invariant magnetic field with the electromagnet coil which is deconvoluted from the time varying magnetic field produced by the induction coil.

Although it is preferred to use the RF induction coil in all aspects of the invention, it is possible omit it in some embodiments; some examples of this are discussed below.

According to another aspect of the present invention there is provided an apparatus for coating or cleaning a substrate, comprising: a vacuum chamber; a substrate carrier adapted to carry a substrate to be cleaned or carried, disposed within said chamber; means for generating material for coating or cleaning the substrate, disposed within said chamber; and a plasma source as described above.

According to another aspect of the present invention there is provided a plasma source comprising an inlet for a gas which is ionisable to produce a plasma, an electron emitter for producing electrons for ionising the gas, means to generate and deliver energy for the generation of broad energy spectrum electrons from the emitter, for effective neutralisation of said plasma, and an anode.

Said generating means preferably comprises a RF induction coil at least partially surrounding the emitter.

The plasma source according to this aspect of the invention may be provided with any combination of the features of the plasma source described above in relation to the first aspect of the invention.

According to another aspect of the present invention there is provided a plasma source comprising an inlet for a gas which is ionisable to produce a plasma, an electron emitter for producing electrons for ionising the gas, means operable to produce a time varying axial magnetic field for enhancement of plasma generation and confinement of said plasma to minimise emitter erosion, and an anode.

Said operable means preferably comprises a RF induction coil at least partially surrounding the emitter. A heating means must be provided to heat the emitter, and in the preferred embodiment this comprises the RF induction coil.

The plasma source according to this aspect of the invention may be provided with any combination of the features of the plasma source described above in relation to the first aspect of the invention.

According to another aspect of the present invention there is provided a method of generating a plasma comprising:
flowing an ionisable gas in contact with an electron emitter, the electron emitter being held at a negative potential; heating the electron emitter to produce a plasma; and delivering energy within the former for the generation of broad energy spectrum electrons for effective neutralisation of said plasma.

According to another aspect of the present invention there is provided a method of generating a plasma comprising: flowing an ionisable gas in contact with an electron emitter, the electron emitter being held at a negative potential; heating the electron emitter to produce a plasma; and producing a time varying axial magnetic field for enhancement of plasma generation and confinement of said plasma to minimise emitter erosion.

According to another aspect of the present invention there is provided a plasma source comprising an inlet for a gas which is ionisable to produce a plasma, an electron emitter for producing electrons for ionising the gas, and an anode, wherein the electron emitter and the anode are provided with separate power supplies which are preferably connected to a common ground.

A heating means must be provided to heat the emitter, and in the preferred embodiment this comprises a RF induction coil.

The plasma source according to this aspect of the invention may be provided with any combination of the features of the plasma source described above in relation to the first aspect of the invention.

The invention also provides a plasma source having a modular construction thereby providing various configurations to tune output plasma current density and spatial distribution for specific process requirements. Thus according to another aspect of the present invention there is provided a plasma source comprising an inlet for a gas which is ionisable to produce a plasma, an electron emitter for producing electrons for ionising the gas, means to heat the electron emitter, an anode, and a magnet, wherein the components are of modular construction thereby facilitating replacement of the components, and adjustment of the relative position of the components.

BRIEF DESCRIPTION OF THE DRAWING

Reference is now made to the accompanying drawings, in which:

FIG. 2b is an exploded view of part of FIG. 2a;

DETAILED DESCRIPTION OF THE EMBODIMENTS

Figure 1:
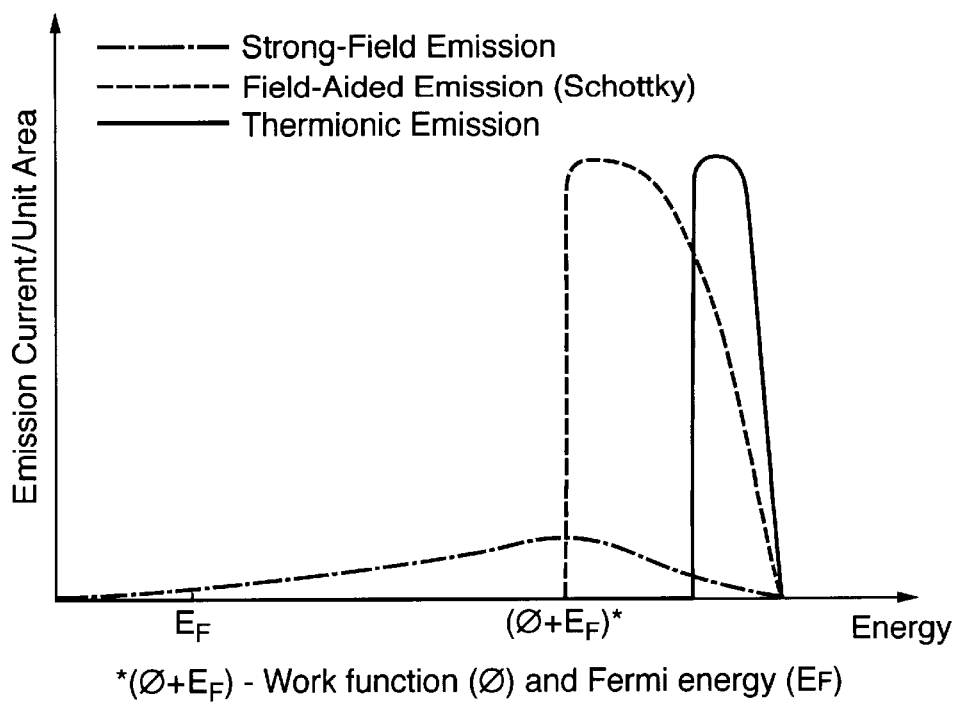
FIG. 1 is a graph comparing the characteristics of thermionic emission, field-aided emission and strong-field emission.

The typical energy distribution of thermionic and field enhanced emission electrons is shown in FIG. 1, indicating a broader spectrum of electron energy from the field enhancement mechanisms. As a consequence of the lower energies such electrons have increased residence time within the plasma, thereby providing enhanced plasma neutralization. Moreover, electron emission current can be accurately controlled through induction coil heating of the emitter temperature.

There are four primary parameters to be controlled in the plasma source:

plasma current: defines number of ions
plasma voltage: determines ion energy
plasma distribution: determined by ion beam divergence
plasma neutralization: determined by ratio of electron to ion current densities and electron energy distribution The spatially tuneable extraction of ion and electron current from the anode to the substrate plane is via the magnetic field generated from the electromagnet. As mentioned above, the spatial distribution of the magnetic field, and hence the plasma flux, is controlled by de-coupling the output magnetic field from that at the cathode. Dynamic control of the field distribution can be achieved by varying the electromagnet coil current.

Additionally the plasma distribution can be controlled by a combination of positioning the electromagnet with respect to the induction coil, aperture size on output of emitter assembly, emitter geometry and spatial variation of number of coil turns along the electromagnet length.

Figure 2A:
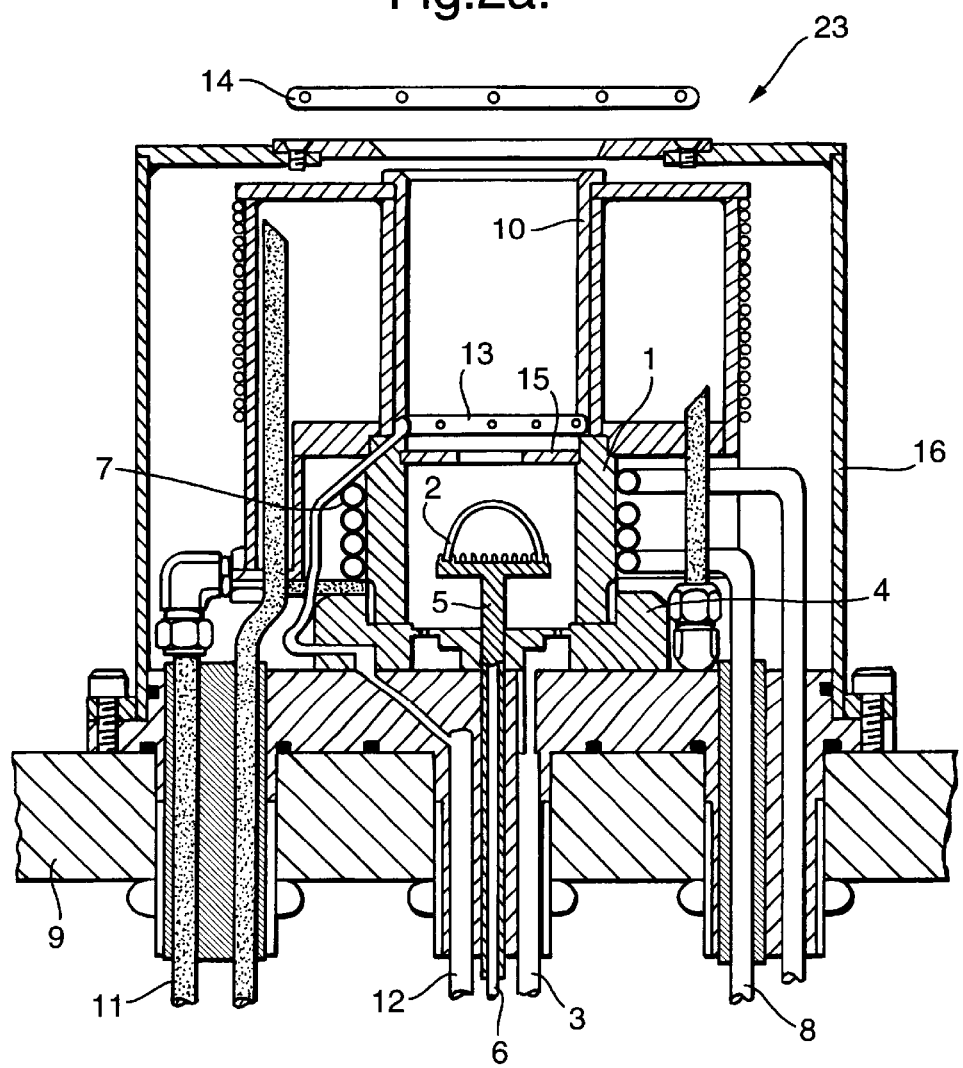
FIG. 2a is a schematic cross-sectional view of an embodiment of a plasma source according to the invention.
Figure 2B:
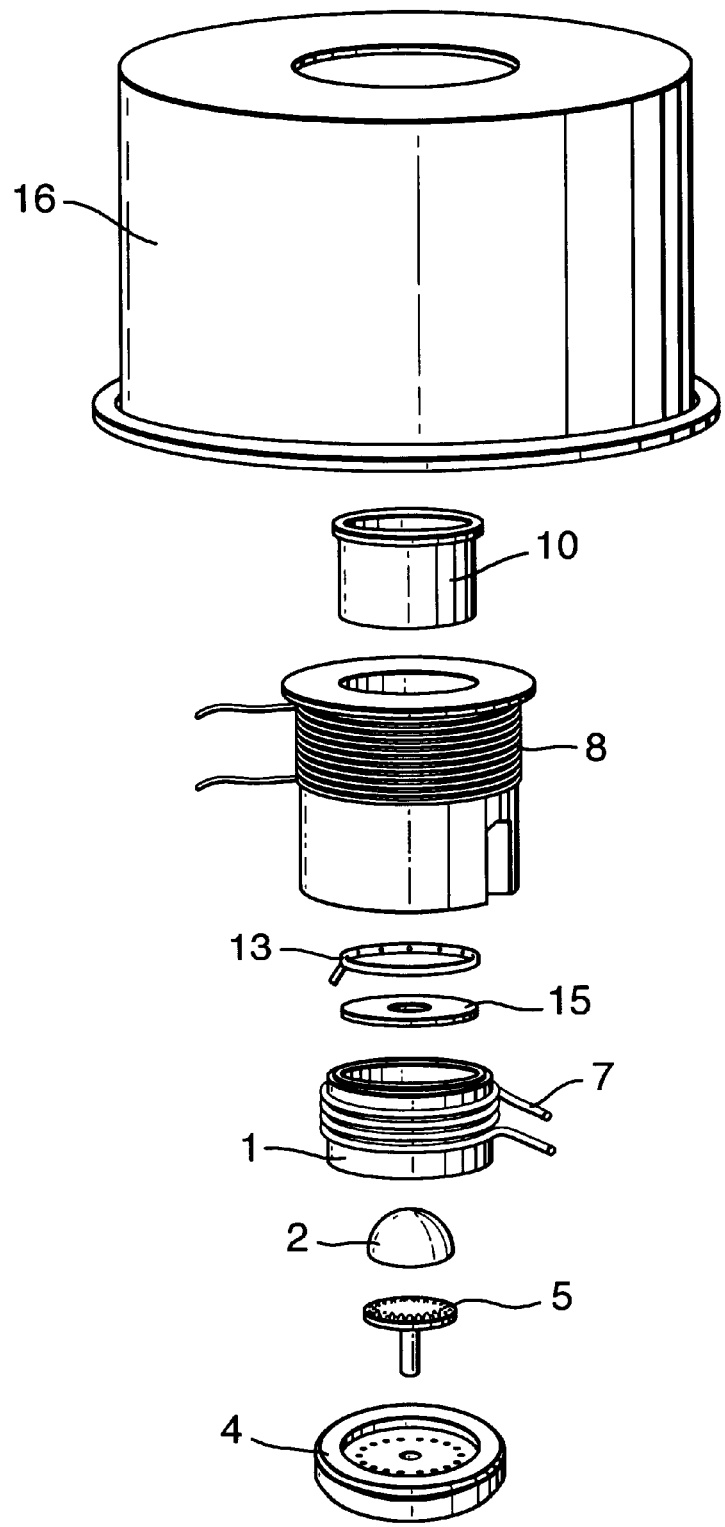

FIGS. 2a and 2b illustrate a plasma source 23 according to the invention. The plasma source 23 includes an electron source comprising a heated high efficiency thermionic-field emitter 2. The emitter 2 is substantially dome shaped—this geometry has been found to provide optimal surface thermionic-field emission and minimal field discontinuities.

The emitter 2 is disposed within a cylindrical former which is made of a high temperature insulator material with a low sputter yield, such as boron nitride or silicon carbide.

A conduit 3 is provided for primary gas feed to a plasma source base 4. The former 1 is disposed on the base 4. A conductive support 5 is provided for the emitter 2 allowing gas to be directed to ionising collisions with electrons from the outer surface of the thermionic-field emitter material 2. The support 5 has an electrical power feed 6. This configuration allows a range of emitter geometries to be accommodated.

The conductive support 5 has a double serrated edge to provide a means of making electrical contact and providing a rigid clamping of the edge of the emitter 2. Moreover, the serrated edge on the conductive support 5 minimises induced eddy current flow and hence heating of the conductive support 5.

The electrical power feed 6 for the conductive support 5 extends through the source base 4 and also through a vacuum system base plate 9. The plasma source base 4 is removable from the former 1, enabling rapid disassembly for cleaning and maintenance.

A water cooled induction coil 7, with associated power feed 8 through the vacuum system base plate 9, is compression fitted to the former 1 and concentric with the thermionic-field emitter 2. A water cooling system 11 is provided for cooling the induction coil 7. The induction coil 7 provides an effective method to control thermionic emitter-field temperature and surface electric electric field, which affects thermionic and field enhanced emission respectively.

Moreover, the enhanced control offered by the induction method allows the thermionic-field emitter material temperature to be accurately controlled and provide a means of controlling balance of thermionic and field emission.

As mentioned above, the induction coil 7 is compression fitted in contact with the supporting former 1, thereby providing a means of cooling the former 1.

The energy of the resulting process gas ions is in part determined by the electric field between an anode 10 located at the source output and the emitter conductive support structure 5.

Moreover, control of electron path from the thermionic-field emitter 2 is provided by the resulting electric field which attracts electrons towards the water cooled anode 10, causing ionisation of gas not ionised within the emitter assembly. Relative positioning of anode 10 with respect to emitter 2 provides predominantly axial electric field and hence axial electron path.

Effective cooling of the anode is achieved using the water cooling system 11.

An additional separately controlled secondary gas inlet 12 is provided at the base of the anode 10, which introduces gas at the base of the anode 10, via a gas ring 13, which maximises usage of the emitted electrons for further ionisation. Moreover, ions generated in the vicinity of the emitter 2 also contribute to ionisation of the gas from the secondary gas inlet 12. Whilst the gas ring 13 is shown at the base of the anode 10, optimal positioning for specific source operating conditions may lie at another position along the length of the anode 10.

Radial electron and ion velocity is minimised using axial magnetic fields. The induction coil 7 provides an axial field in the cathode vicinity, where this field is time varying due to the alternating current (AC) in the coil 7. The AC is of a temporal form to minimise zero field time (typical frequency as determined by the induction coil 7 is between 5 and 500 kHz).

Although the axial field direction changes in response to the AC, the electron and ion radial velocity remain minimised, with only the sense of cyclotron motion changing dependant upon the direction of the magnetic field. Moreover, the induced axial magnetic field in the cathode assembly causes ionised gas and electrons to spiral along field lines out of the cathode region towards the anode 10.

Extraction of ion and electron current from the anode 10 to the substrate plane is via the magnetic field generated from an electromagnet 28.

A reactive gas is introduced via a gas ring 14 at the top of the plasma source. Ionisation is achieved by collisions with the ionised gas emanating from the plasma source and also electron collisions.

Protection of the anode/emitter assembly is achieved through use of a stainless steel shroud 16.

Dynamic control of the field distribution and hence plasma spatial distribution is achieved by varying the current of electromagnet field coil 28. Further control of spatial distribution of plasma can be achieved by varying the spatial distribution of coil turns along the length of the electromagnet 28.

Additional control of plasma spatial distribution at the substrate plane is provided by relative positioning of the electromagnet 28 with respect to the induction coil 7 and selection of the aperture size of a replaceable cap 15, so that the cap 15 has a desired aperture diameter. The cap 15 may be a boron nitride material.

The electromagnet 28 is adapted to slide on and off the anode 10, allowing adjustment with respect to displacement from the induction coil 7. These parameters influence the plasma spatial extent at the substrate plane through control of the lateral spatial extent of plasma within the source.

Ion energy at the substrate plane as assessed using a Faraday cup is dependant upon anode voltage, magnetic field and source configuration with respect to cathode and spatial tuning method(s) being employed. Typical source running conditions produce ion energies in the range 10 to 200 eV.

Figure 5:
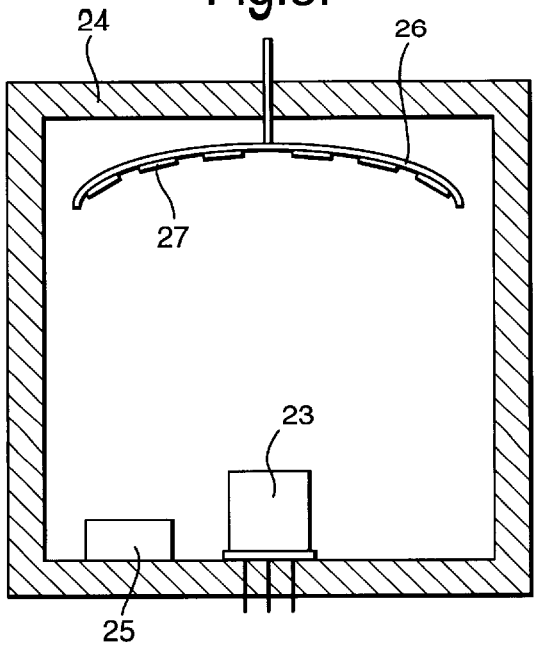
FIG. 5 is a schematic illustration of an apparatus according to the invention for coating or cleaning substrates.

The dependences on plasma source running parameters are indicated as follows:

Plasma (ion) current:
  A function of gas flows and chamber pressure
  Dependent on electron emission efficiency (anode to cathode current)
  Dependent on emitter temperature
Plasma (beam) voltage:
  A function of anode voltage with respect to substrates (ground)
  Dependent on plasma impedance (anode to emitter voltage)
  Dependent on induction current
  Dependent on cathode temperature
Plasma distribution:
  A function of plasma extraction magnetic field (coil current)
Plasma neutralization:
  A function of emitter electron emission characteristics FIG. 5 illustrates an apparatus for coating or cleaning substrates, which comprises a vacuum chamber 24 within which is disposed the plasma source 23. The apparatus further comprises a substrate carrier 26 which carries a substrate 27 to be coated or cleaned. The apparatus also includes a vaporiser 25 for producing the material used to coat or clean the substrate 27. The vaporiser 25 could be, for example, and electron beam vaporiser or a thermal vaporiser, or any other suitable device for provided the material in an appropriate form.

Figure 3:
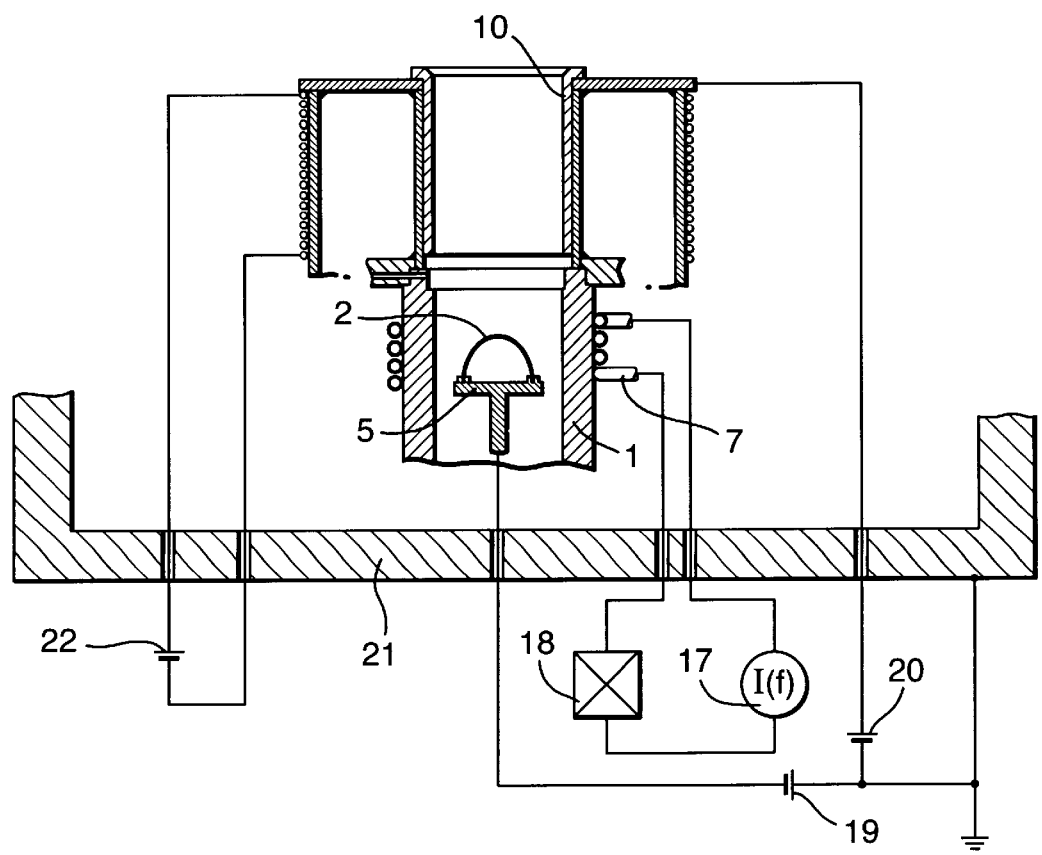
FIG. 3 is a schematic illustration of an embodiment of an electrical and control configuration for the plasma source shown in FIG. 1.

An embodiment of the control and electrical configuration for the plasma source is shown in FIG. 3.

The induction coil 7, concentric with the emitter 2, is powered by an RF power supply 17 tuned to the induction coil 7 via a matching block 18. Running frequency is determined by the number of induction coil turns. Coil current is controlled from the power supply 17. Typical RF supply is 3 KW with tuneable frequency range typically 70 kHz to 500 kHz, providing a means to control emitter temperature and field electron emission characteristic. In general the radio frequency is in the range 3 KHz to 300 GHz; we prefer that the frequency used is at least 20 kHz, more preferably at least 50 KHz and most preferably at least 70 KHz; we also prefer that the frequency is no more than 10000 KHz, preferably no more than 1000 KHz, and most preferably no more than 500 KHz.

Anode 10 to emitter 2 current is controlled by a power supply 19 regulating current to the emitter/anode.

The stability of process maintained by series of open and closed loop feedback controls, summarized as follows:

Constant Ar and $O_2$ gas flows to plasma source (open loop)

Constant total pressure essential (mass flow control closed feedback loop)

Ion current controlled by discharge voltage (closed loop)

Figure 4A:
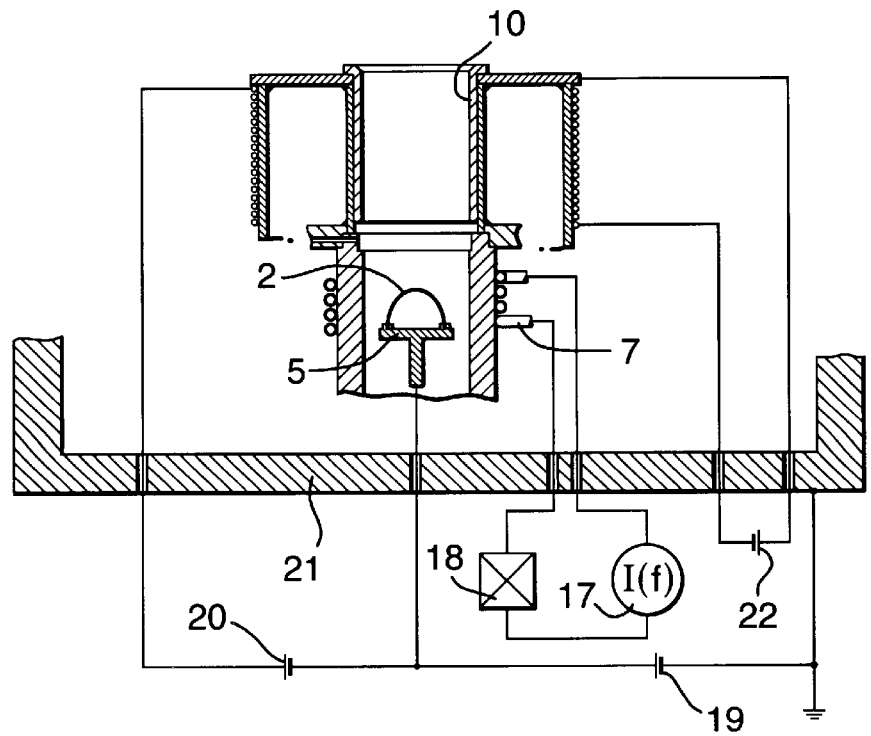
FIGS. 4a, 4b and 4c are schematic illustrations of alternative embodiments of an electrical and control configuration for the plasma source shown in FIG. 1.
Figure 4B:
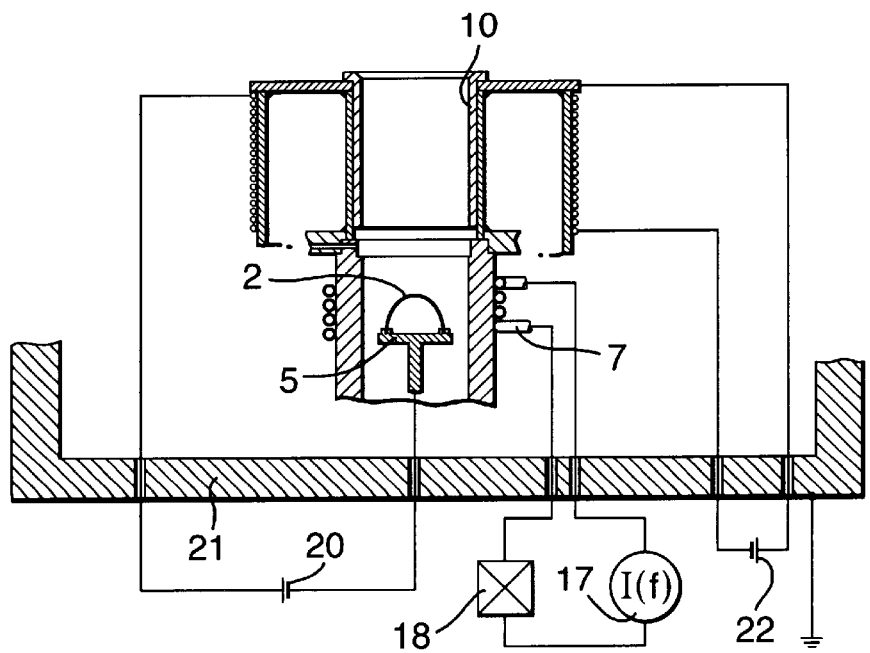
Figure 4C:
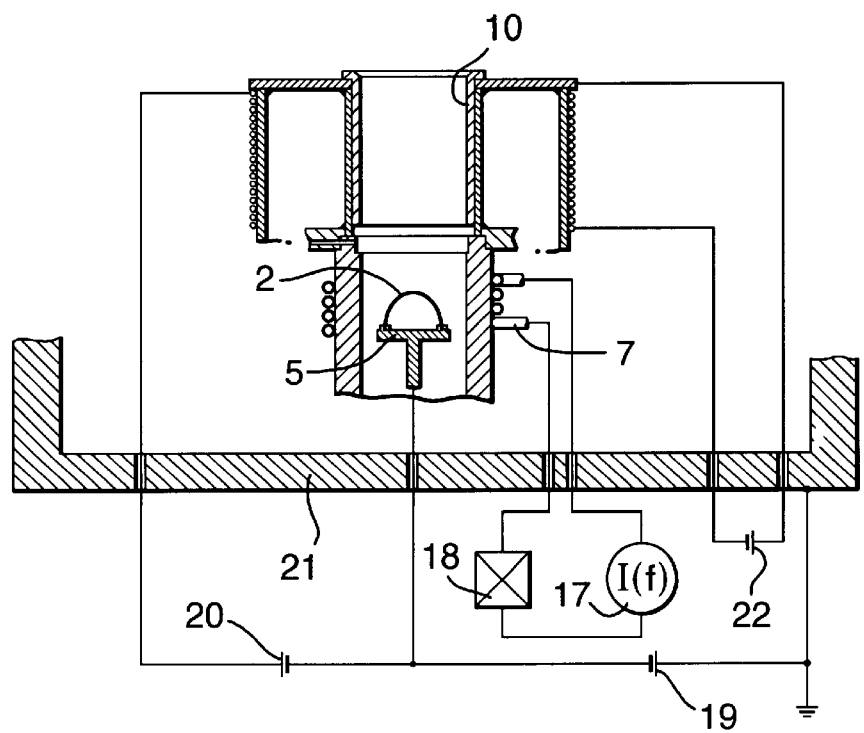

Plasma energy controlled by constant anode to ground voltage by:
  emitter temperature/Induction heater current (17—closed loop) emitter to ground voltage (closed loop twin power supply 19, 20 configuration). Power supply 20 provides a means of fine tuning ion energy whilst supply 19 supplies current to the emitter. Power supplies 17, 19 and 20 are grounded earthed as is the vacuum chamber 21. The earth connection provides a return path for electrons from the plasma. Various configurations of twin power supplies 19 and 20 are possible as shown in FIGS. 4a, 4b and 4c, in which like parts are designated with like reference numerals. These configurations provide a variety of return paths for electron flow which can be matched to chamber configuration and specific process application.

Plasma neutralization is controlled by emitter 2 temperature and surface electric field. These parameters can be set primarily by induction coil 7 current and frequency.

Plasma distribution set by extraction current (electromagnet current supply 22—open loop), which determines magnetic flux strength and spatial distribution.

Typical source running conditions are:

Induction coil—Current 200 A, frequency 105 kHz

Emitter current—40 A

Ion current density (500 mm from source)—typically 0.4 $mA/cm^2$

Ion energy—typically 80 eV

Use of the plasma source for assisted deposition of optical coatings is described below.

Figure 6:
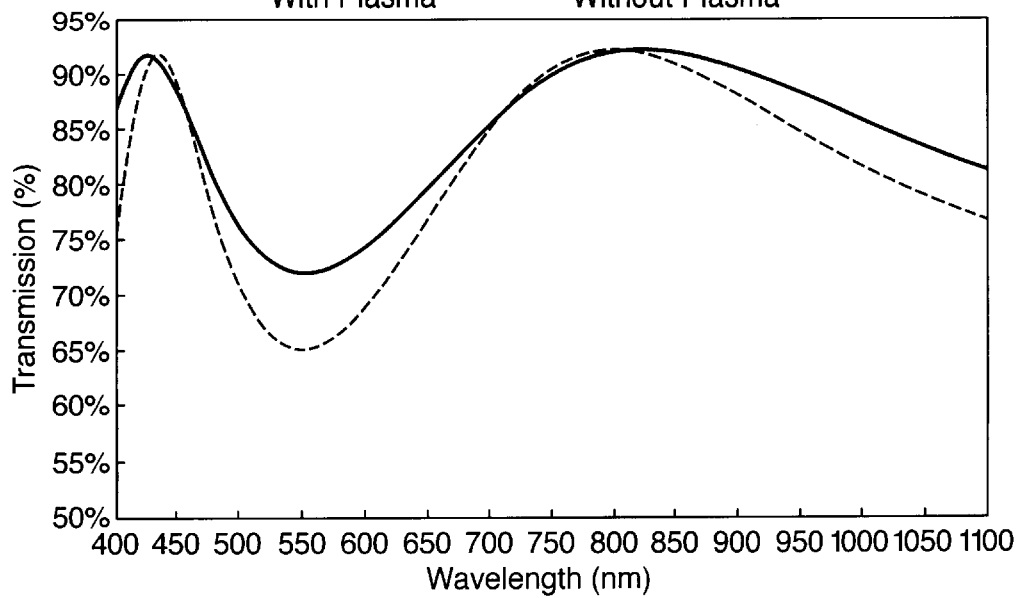
FIG. 6 is a graph showing the transmission spectra of titanium dioxide with and without plasma assist during deposition.

FIG. 6 shows the transmission spectra of titanium dioxide (film thickness approximately 2000 A) with and without plasma assist during deposition (electron beam evaporation utilised with throw distance from electron gun to substrate plane of 500 mm). The increase in modulation with plasma assist is a consequence of increased refractive index (refractive index at 550 nm without and with plasma assist are 2.20 and 2.40 respectively). Increased refractive index is a consequence of densification during the film growth.

Figure 7:
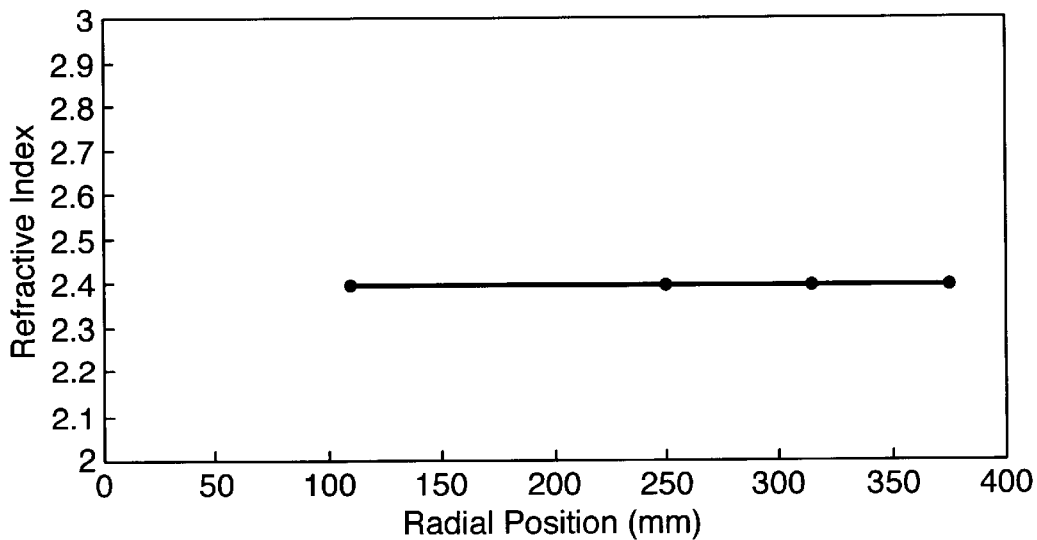
FIG. 7 is a graph showing plasma assisted titanium dioxide refractive index as a function of position across the substrate plane.

FIG. 7 shows plasma assisted titanium dioxide refractive index as a function of position across the substrate plane (same evaporation method and geometry as FIG. 5). Plasma source spatial output was tuned to provide wide coverage over the calotte.

Figure 8:
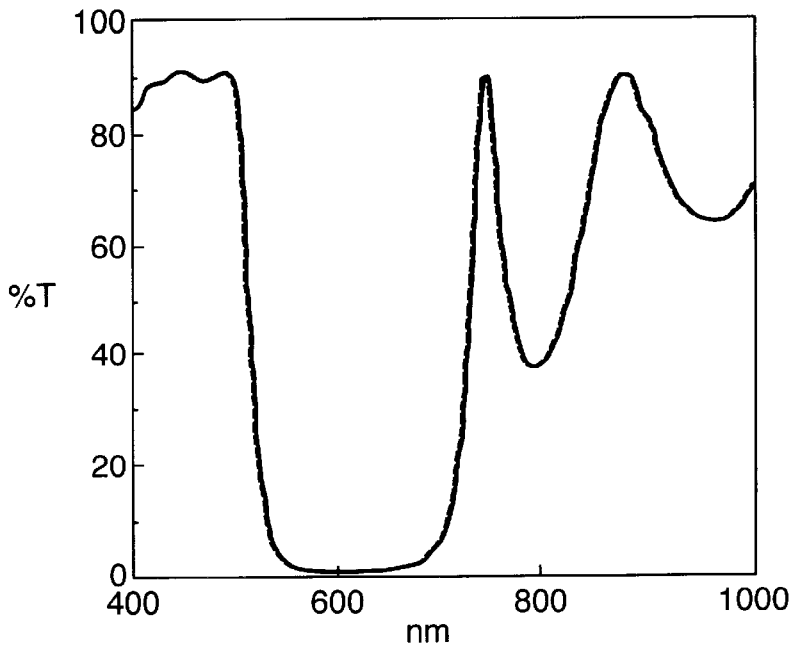
FIG. 8 is a graph showing the transmission spectra for a plasma assisted silica/titania high precision optical coating.

FIG. 8 shows the transmission spectra for a plasma assisted silica/titania high precision optical coating measured at room temperature and 250° C. (same evaporation method and geometry a FIG. 5). No drift in the spectral performance is observed indicating full film densification has been achieved.

It will be appreciated that the invention described above may be modified. For example, the electromagnet could be replaced by any suitable device that produces a magnetic field, including a permanent magnet. Furthermore the induction coil could be replaced by any suitable device that performs the same function as the induction coil.

What is claimed is:

1. A plasma source comprising an inlet for a gas which is ionisable to produce a plasma, an electron emitter for producing electrons for ionising the gas, an RF induction coil at least partially surrounding the electron emitter, an anode and a cylindrical former of electrical insulator material capable of withstanding high temperature and disposed within the induction coil, wherein the emitter is in the form of multiple cylinders of thermionic-field emitting material arranged on the circumference of a circle lying within the insulating former, and wherein the emitter is disposed substantially concentrically within the induction coil and the former.

2. The plasma source according to claim 1, further comprising a control means to operate the induction coil to deliver energy within the former for the generation of broad energy spectrum electrons for effective neutralisation of said plasma.

3. A plasma source comprising an inlet for a gas which is ionisable to produce a plasma, an electron emitter for producing electrons for ionising the gas, an RF induction coil at least partially surrounding the electron emitter, an anode and a control means to operate the induction coil to produce a time varying axial magnetic field for enhancement of plasma generation and confinement of said plasma to minimise emitter erosion, wherein the anode is surrounded by an electromagnet capable of producing a time invariant magnetic field, the time invariant magnetic field produced by the electromagnet being deconvoluted from the induced time variant magnetic field.

4. The plasma source according to claim 3, wherein the electromagnet is adapted to slide on and off the anode and is adjustable with respect to displacement from the induction coil, the electromagnet is in the form of a coil, the number of turns of which is varied along its length to spatially vary the magnetic field and hence the plasma spatial distribution at the substrate plane, and the electromagnet is frequency and phase coupled with the induction coil.

5. A plasma source comprising an inlet for a gas which is ionisable to produce a plasma, an electron emitter for producing electrons for ionising the gas, an RF induction coil at least partially surrounding the electron emitter and an anode, wherein the emitter is in the form of a cylinder of varied width and height with a flat top, thereby allowing the spatial distribution of emitted electrons to be changed.

6. A plasma source comprising an inlet for a gas which is ionisable to produce a plasma, an electron emitter for producing electrons for ionising the gas, an R.F induction coil at least partially surrounding the electron emitter, an anode, a removable base, said base including at least part of the gas inlet; a cap disposed between the anode and cathode, wherein the cap has an aperture of variable size; a secondary inlet for said gas, said secondary inlet being arranged to inject the gas into a space within the anode; and a reactive gas inlet located at the top of the anode.

7. A method of generating a plasma comprising:

flowing an ionisable gas in contact with an electron emitter, the electron emitter being held at a negative potential; and heating the electron emitter using a RF induction coil to produce electrons from the emitter which ionise the gas to produce a plasma, wherein the induction coil is operated to produce a time varying axial magnetic field for enhancement of plasma generation and confinement of said plasma to minimise emitter erosion.

8. The method according to claim 7, wherein the induction coil is operated to deliver energy within the former for the generation of broad energy spectrum electrons for effective neutralisation of said plasma.

9. The method according to claim 7, wherein an anode and an electromagnet coil are disposed downstream of the emitter, and further comprising producing a time invariant magnetic field with the electromagnet coil which is deconvoluted from the time varying magnetic field produced by the induction coil.

* * * * *